United States Patent
Yi

(10) Patent No.: US 10,354,588 B2
(45) Date of Patent: Jul. 16, 2019

(54) DRIVING METHOD FOR PIXEL CIRCUIT TO PREVENT ABNORMAL PICTURE DISPLAY GENERATED BY WRONG CHARGING

(71) Applicant: Shenzhen China Star Optoelectronics Technology Co., Ltd., Shenzhen, Guangdong (CN)

(72) Inventor: Shijuan Yi, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 110 days.

(21) Appl. No.: 15/317,498

(22) PCT Filed: Nov. 16, 2016

(86) PCT No.: PCT/CN2016/106035
§ 371 (c)(1),
(2) Date: Dec. 9, 2016

(87) PCT Pub. No.: WO2018/035994
PCT Pub. Date: Mar. 1, 2018

(65) Prior Publication Data
US 2018/0211597 A1    Jul. 26, 2018

(30) Foreign Application Priority Data
Aug. 24, 2016 (CN) .......................... 2016 1 0710911

(51) Int. Cl.
*G09G 3/3258* (2016.01)
*H01L 27/32* (2006.01)
(Continued)

(52) U.S. Cl.
CPC ......... *G09G 3/3258* (2013.01); *G09G 3/3233* (2013.01); *G09G 3/3291* (2013.01);
(Continued)

(58) Field of Classification Search
CPC .............. G09G 3/3258; H01L 27/3211; H01L 27/3276
See application file for complete search history.

(56) References Cited

U.S. PATENT DOCUMENTS 7,701,426 B2 * 4/2010 Yokoyama ........... G09G 3/3648
345/103
8,199,079 B2 6/2012 Kim et al.
(Continued)

FOREIGN PATENT DOCUMENTS

CN    203882587 U    10/2014
CN    104978923 A    10/2015
(Continued)

*Primary Examiner* — Kwang-Su Yang
(74) *Attorney, Agent, or Firm* — Andrew C. Cheng

(57) ABSTRACT

A driving method for a pixel circuit comprises steps of: receiving a data control signal inputted by a driving chip and resetting a data line of a pixel unit according to the data control signal; charging the pixel unit to a target voltage according to the data line control signal; and receiving a control signal to control the pixel unit to display a corresponding grayscale level according to the target voltage. Through above way, the present invention can prevent a wrong charging which will generate an abnormal picture display.

14 Claims, 4 Drawing Sheets

(51) Int. Cl.
*G09G 3/3233* (2016.01)
*G09G 3/3291* (2016.01)

(52) U.S. Cl.
CPC ...... *H01L 27/3211* (2013.01); *H01L 27/3276* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01); *G09G 2310/0297* (2013.01); *G09G 2320/043* (2013.01)

(56) References Cited

U.S. PATENT DOCUMENTS

| | | | |
|---|---|---|---|
| 8,299,990 B2* | 10/2012 | Park | G09G 3/2007 345/214 |
| 9,076,382 B2 | 7/2015 | Choi | |
| 2006/0151745 A1* | 7/2006 | Kim | G09G 3/325 252/301.16 |
| 2017/0148379 A1* | 5/2017 | Cho | G09G 3/325 |

FOREIGN PATENT DOCUMENTS

| | | |
|---|---|---|
| JP | 201122373 A | 2/2011 |
| KR | 1020070071524 A | 7/2007 |

* cited by examiner

DRIVING METHOD FOR PIXEL CIRCUIT TO PREVENT ABNORMAL PICTURE DISPLAY GENERATED BY WRONG CHARGING

BACKGROUND OF THE INVENTION

1. Field of the Invention

The present invention relates to an active-matrix organic light emitting diode (AMOLED) technology field, and more particularly to a driving method for a pixel circuit.

2. Description of Related Art

An active-matrix organic light emitting diode (AMOLED) panel has a self-luminous property, and adopting a very thin organic coating layer and a glass substrate. When a current pass through, the organic coating layer will emit light. Because the AMOLED is driven by current, the AMOLED is very sensitive to the change of the voltage. Specifically, a drift of the threshold voltage easily causes an uneven display of the panel. Accordingly, the pixel compensation circuit of the AMOLED is very important. The pixel circuit of the AMOLED can compensate the drift of the threshold voltage in order to increase the display uniformity of the OLED panel.

Along with the development of the thin-film transistor of the Low Temperature Poly-silicon (LTPS) semiconductor, because the LTPS semiconductor has a super- high carrier mobility itself, the many people research the related technology of the System on Panel (SOP peripheral integrated circuit of the panel also become the focus of attention, and), and being realized gradually. In the panel design, in order to decrease the cost of the driving chip (IC) and the Chip On Film (COF), a demux circuit design is usually adopted.

In a general OLED, in the timing diagram that the data line (Data) input a signal through the demux circuit, before a data signal of the data line is inputted, a resetting operation for the data signal of the data line is not executed in a display region (AA region). The data signal in the AA region maintains at a floating voltage before the demux circuit provides a signal. When a scanning signals is inputted, the floating voltage will charge a sub-pixel circuit so as to generate an abnormal picture display.

SUMMARY OF THE INVENTION

The embodiment of the present invention provides a gate driving circuit, which can effectively prevent an abnormal picture display generated by a wrong charging.

The present invention provides a driving method for a pixel circuit, comprising steps of: receiving a data line control signal inputted by a driving chip and resetting a data line of a pixel unit according to the data line control signal, wherein the pixel unit comprises a R sub-pixel, a G sub-pixel and a B sub-pixel, and according to the received data line control signal, simultaneously resetting the R sub-pixel, the G sub-pixel and the B sub pixel; charging the pixel unit to a target voltage according to the data line control signal; receiving a control signal to control the pixel unit to display a corresponding grayscale level according to the target voltage; wherein, pixel circuit comprises a first MOS transistor, a gate of the first MOS transistor is connected with a data line selection signal, a drain of the first MOS transistor receives the data line control signal inputted by a driving chip, a source of the first MOS transistor is connected with the data line; and wherein, the step of receiving a data line control signal inputted by a driving chip and resetting a data line of a pixel unit according to the data line control signal comprises a step of: the data line selection signal controls the first MOS transistor to be turned on, the data line control signal inputted by the driving chip is inputted to the data line through the first MOS transistor and resetting the data line.

Wherein, the step of charging the pixel unit to a target voltage comprises a step of: sequentially charging the R sub-pixel, the G sub-pixel and the B sub-pixel to corresponding target voltages.

Wherein, the pixel circuit includes a R sub-pixel circuit, a G sub-pixel unit and a B sub-pixel unit, each sub-pixel circuit further comprises a second MOS transistor, a third MOS transistor and a first MOS transistor unit; a gate of the second MOS transistor is connected with a first scanning signal, a drain of the second MOS transistor is connected with a drain of the third MOS transistor, a gate and a source of the third MOS transistor are connected with the first MOS transistor unit; the first MOS transistor unit further connects with the first scanning signal, wherein a voltage of the gate of the third MOS transistor is a voltage of the sub-pixel; the step of charging the pixel unit to a target voltage according to the data line control signal comprises a step of: sequentially for the R sub-pixel, the G sub-pixel and the B sub-pixel, the first scanning signal controlling the second MOS transistor and the first MOS transistor unit to be turned on, and the data line selection signal controlling the first MOS transistor to be turned on; and the data line control signal inputted by the driving chip charging the sub-pixel to the target voltage through the first MOS transistor and the second MOS transistor.

Wherein, the first MOS transistor unit comprises a sixth MOS transistor and a seventh MOS transistor, gates of the sixth MOS transistor and the seventh are connected with the with the first scanning signal, a drain of the sixth is connected with the gate of the third MOS transistor, a source of the sixth MOS transistor is connected with a drain of the seventh MOS transistor, a source of the seventh MOS transistor is connected with the source of the third MOS transistor; the step of the first scanning signal controlling the first MOS transistor unit to be turned on comprises a step of: the first scanning signal controlling the sixth MOS transistor and the seventh MOS transistor to be turned on simultaneously.

Wherein, each of the first MOS transistor, the second MOS transistor, the third MOS transistor, the sixth MOS transistor and the seventh MOS transistor is a PMOS transistor.

Wherein, each of the first MOS transistor, the second MOS transistor, the third MOS transistor, the sixth MOS transistor and the seventh MOS transistor is a NMOS transistor.

Wherein, each sub-pixel circuit further includes a eighth MOS transistor and a ninth MOS transistor, gates of the sixth MOS transistor and the seventh MOS transistor are connected with the control signal. a drain of the eighth MOS transistor is connected with a first reference voltage, a source of the eighth MOS transistor is connected with the drain of the third MOS transistor, a drain of the ninth MOS transistor is connected with the source of the third MOS transistor, a source of the ninth MOS transistor is connected with a positive electrode of a light-emitting diode, a negative electrode of the light-emitting diode is connected with a second reference voltage; and the step of receiving a control signal to control the pixel unit to display a corresponding grayscale level according to the target voltage comprises a step of: the control signal controlling the eight MOS transistor and the ninth MOS transistor to be turned on, and the light-emitting diode emits light according a current formed by the target voltage to display the corresponding grayscale level.

Wherein, each sub-pixel circuit further includes an fourth MOS transistor and a fifth MOS transistor, gates of the fourth MOS transistor and the fifth MOS transistor are connected with a second scanning signal, a drain of the fourth MOS transistor is connected with the gate of the third MOS transistor, a source of the fourth MOS transistor is connected with a drain of the fifth MOS transistor, a source of the fifth MOS transistor is connected with a reset signal; and before the step of receiving a data line control signal inputted by a driving chip, the second scanning signal controls the fourth MOS transistor and the fifth MOS transistor to be turned on, and the reset signal is transmitted to the gate of the third MOS transistor to perform a resetting.

The present invention also provides a driving method for a pixel circuit, comprising steps of: receiving a data line control signal inputted by a driving chip and resetting a data line of a pixel unit according to the data line control signal; charging the pixel unit to a target voltage according to the data line control signal; and receiving a control signal to control the pixel unit to display a corresponding grayscale level according to the target voltage.

Wherein, the pixel unit comprises an R sub-pixel, a G sub-pixel and a B sub-pixel, and the step resetting a data line of a pixel unit comprises a step of according to the received data line control signal, simultaneously resetting the R sub-pixel, the G sub-pixel and the B sub pixel.

Wherein, the step of charging the pixel unit to a target voltage comprises a step of: sequentially charging the R sub-pixel, the G sub-pixel and the B sub-pixel to corresponding target voltages.

Wherein, pixel circuit comprises a first MOS transistor, a gate of the first MOS transistor is connected with a data line selection signal, a drain of the first MOS transistor receives the data line control signal inputted by a driving chip, a source of the first MOS transistor is connected with the data line; and wherein, the step of receiving a data line control signal inputted by a driving chip and resetting a data line of a pixel unit according to the data line control signal comprises a step of: the data line selection signal controls the first MOS transistor to be turned on, the data line control signal inputted by the driving chip is inputted to the data line through the first MOS transistor and resetting the data line.

Wherein, the pixel circuit includes a R sub-pixel circuit, a G sub-pixel unit and a B sub-pixel unit, each sub-pixel circuit further comprises a second MOS transistor, a third MOS transistor and a first MOS transistor unit; a gate of the second MOS transistor is connected with a first scanning signal, a drain of the second MOS transistor is connected with a drain of the third MOS transistor, a gate and a source of the third MOS transistor are connected with the first MOS transistor unit; the first MOS transistor unit further connects with the first scanning signal, wherein a voltage of the gate of the third MOS transistor is a voltage of the sub-pixel; the step of charging the pixel unit to a target voltage according to the data line control signal comprises a step of: sequentially for the R sub-pixel, the G sub-pixel and the B sub-pixel, the first scanning signal controlling the second MOS transistor and the first MOS transistor unit to be turned on, and the data line selection signal controlling the first MOS transistor to be turned on; and the data line control signal inputted by the driving chip charging the sub-pixel to the target voltage through the first MOS transistor and the second MOS transistor.

Wherein, the first MOS transistor unit comprises a sixth MOS transistor and a seventh MOS transistor, gates of the sixth MOS transistor and the seventh MOS transistor are connected with the first scanning signal, a drain of the sixth MOS transistor is connected with the gate of the third MOS transistor, a source of the sixth MOS transistor is connected with a drain of the seventh MOS transistor, a source of the seventh MOS transistor is connected with the source of the third MOS transistor; the step of the first scanning signal controlling the first MOS transistor unit to be turned on comprises a step of: the first scanning signal controlling the sixth MOS transistor and the seventh MOS transistor to be turned on simultaneously.

Wherein, each of the first MOS transistor, the second MOS transistor, the third MOS transistor, the sixth MOS transistor and the seventh MOS transistor is a PMOS transistor.

Wherein, each of the first MOS transistor, the second MOS transistor, the third MOS transistor, the sixth MOS transistor and the seventh MOS transistor is a NMOS transistor.

Wherein, each sub-pixel circuit further includes a eight MOS transistor and a ninth MOS transistor, gates of the eighth MOS transistor and the ninthMOS transistor are connected with the control signal. a drain of the ninth MOS transistor is connected with a first reference voltage, a source of the eighth MOS transistor is connected with the drain of the third MOS transistor, a drain of the ninth MOS transistor is connected with the source of the third MOS transistor, a source of the ninth MOS transistor is connected with a positive electrode of a light-emitting diode, a negative electrode of the light-emitting diode is connected with a second reference voltage; and the step of receiving a control signal to control the pixel unit to display a corresponding grayscale level according to the target voltage comprises a step of: the control signal controlling the eighth MOS transistor and the ninth MOS transistor to be turned on, and the light-emitting diode emits light according a current formed by the target voltage to display the corresponding grayscale level.

Wherein, each sub-pixel circuit further includes an fourth MOS transistor and a fifth MOS transistor, gates of the fourth MOS transistor and the fifth MOS transistor are connected with a second scanning signal, a drain of the fourth MOS transistor is connected with the gate of the third MOS transistor, a source of the fourth MOS transistor is connected with a drain of the fifth MOS transistor, a source of the fifth MOS transistor is connected with a reset signal; and before the step of receiving a data line control signal inputted by a driving chip, the second scanning signal controls the fourth MOS transistor and the fifth MOS transistor to be turned on, and the reset signal is transmitted to the gate of the third MOS transistor to perform a resetting.

Through the above solution, the beneficial effect of the present invention is: the present invention can effectively prevent a wrong charging, which will generate an abnormal picture display through receiving a data line control signal inputted by a driving chip and resetting a data line of a pixel unit according to the data line control signal; charging the pixel unit to a target voltage according to the data line control signal; and receiving a control signal to control the pixel unit to display a corresponding grayscale level according to the target voltage.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures. In the figures.

DETAILED DESCRIPTION OF THE PREFERRED EMBODIMENT

Figure 1:
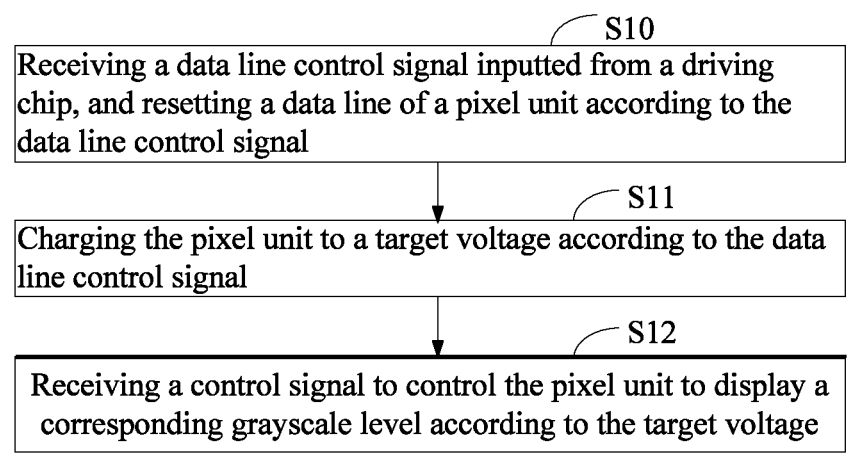
FIG. 1 is a flow chart of a driving method for a pixel circuit according to an embodiment of the present invention.
Figure 2:
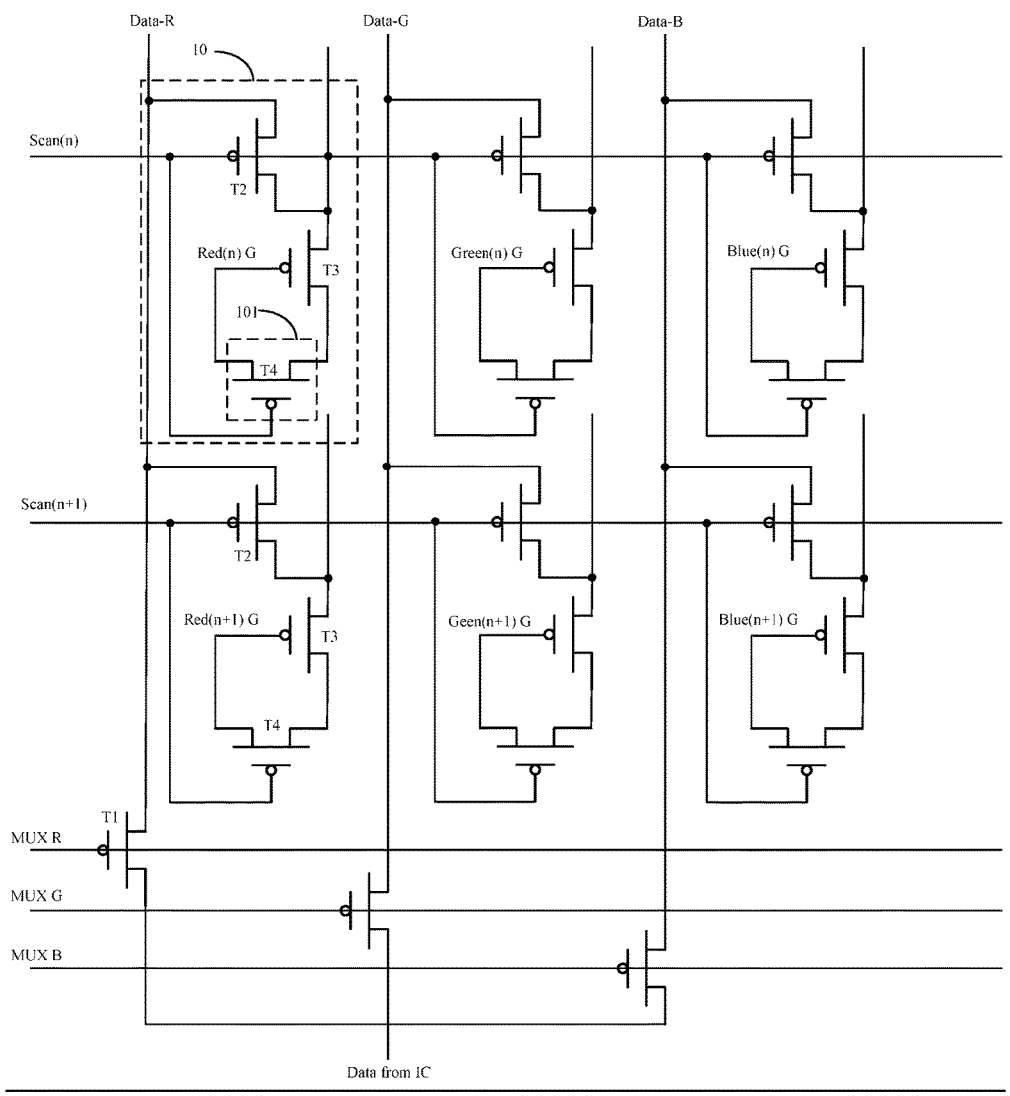
FIG. 2 is a circuit diagram of the pixel circuit according to an embodiment of the present invention.
Figure 3:
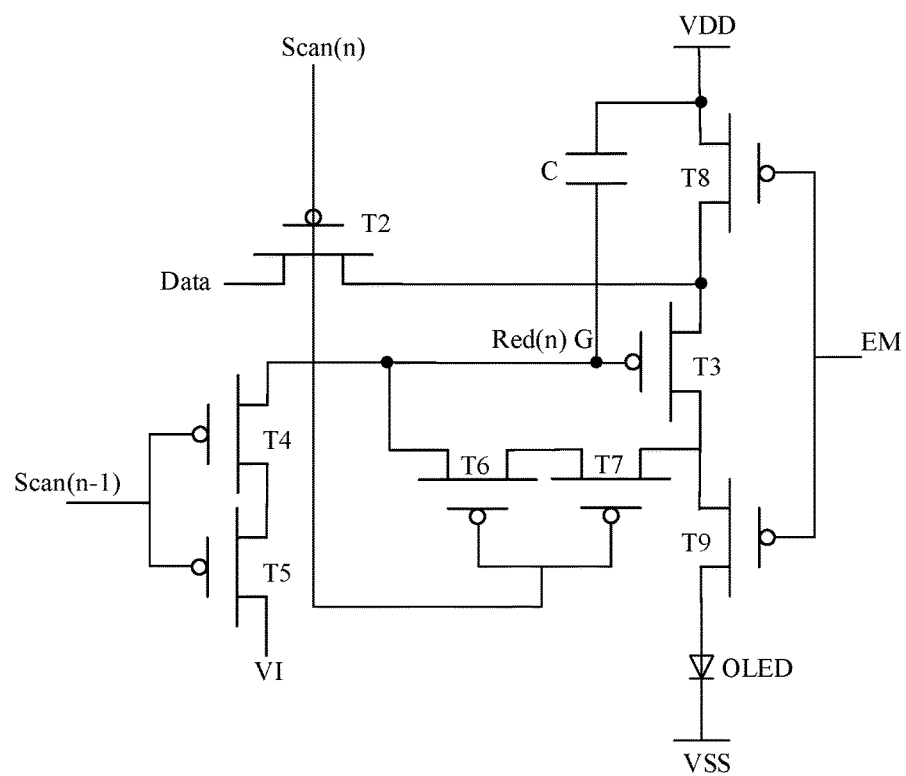
FIG. 3 is a circuit diagram of a sub-pixel circuit according to an embodiment of the present invention.

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention With reference to FIG. 1 to FIG. 3, FIG. 1 is a flow chart of a driving method for a pixel circuit according to an embodiment of the present invention. FIG. 2 is a circuit diagram of the pixel circuit according to an embodiment of the present invention, and FIG. 3 is a circuit diagram of a sub-pixel circuit according to an embodiment of the present invention. The driving method for the pixel circuit includes:

Step S10: receiving a data line control signal inputted from a driving chip, and resetting a data line of a pixel unit according to the data line control signal.

In the present embodiment, the pixel unit includes an R sub-pixel, a G sub-pixel and a B sub-pixel. Correspondingly, in the step S10, simultaneously resetting the R sub-pixel, the G sub-pixel and the B sub-pixel according to the received data line control signal. Specifically, before the data line charges the pixel unit, resetting the data line by receiving the data line control signal inputted from the driving chip in order to ensure that in a next period, the pixel unit can prevent a wrong charging, which will generate an abnormal display picture.

Step S11: charging the pixel unit to a target voltage according to the data line control signal.

In the step S11, sequentially charging the R sub-pixel, the G sub-pixel and the B sub-pixel to corresponding target voltages. With reference to FIG. 2, in the embodiment of the present invention, the pixel units are arranged as a matrix, and are connected to scanning lines and data lines. The pixel circuit of each pixel unit includes an R sub-pixel circuit, G sub-pixel circuit and a B sub-pixel unit. The sub-pixel units commonly use one scanning line, and different sub-pixels correspond to different data lines. The pixel circuit includes a first MOS transistor T1, a gate of the first MOS transistor T1 is connected with a data line selection signal. A drain of the first MOS transistor T1 receives the data line control signal (Data from IC) inputted from the driving chip. A source of the first MOS transistor T1 is connected with the data line. The data line selection signal controls the first MOS transistor T1 to be conductive such that the data line control signal (Data from IC) inputted from the driving chip is inputted to the data line through the first MOS transistor T1 in order to reset the data line.

With reference to FIG. 2, the pixel circuit includes an R sub-pixel circuit, a G sub-pixel unit and a B sub-pixel unit. Using the R sub-pixel circuit of one pixel unit as an example. Each sub-pixel circuit 10 further includes a second MOS transistor T2, a third MOS transistor T3 and a first MOS transistor unit 101. A gate of the second MOS transistor T2 is connected with a first scanning signal Scan(n), a drain of the second MOS transistor T2 is connected with a drain of the third MOS transistor T3, a gate and a source of the third MOS transistor T3 are connected with the first MOS transistor unit 101. The first MOS transistor unit 101 further connects with the first scanning signal Scan(n), wherein, a voltage of the gate of the third MOS transistor T3 is a voltage of the sub-pixel.

In the step S11, sequentially for the R sub-pixel, the G sub-pixel and the B sub-pixel, the first scanning signal Scan(n) controls the second MOS transistor T2 and the first MOS transistor unit 101 to be turned on. The data line selection signal controls the first MOS transistor T1 to be turned on; the data line control signal (Data from IC) inputted by the driving chip charges the sub-pixel to the target voltage through the first MOS transistor T1 and the second MOS transistor T2. Specifically, when the first scanning signal Scan(n) controls the second MOS transistor T2 in the R sub-pixel, the G sub-pixel and the B sub-pixel to be turned on, firstly, the data line selection signal Mux R controls the first MOS transistor T1 corresponding to the R sub-pixel to be turned on, the data line control signal (Data from IC) inputted by the driving chip charges the R sub-pixel to a target voltage through the first MOS transistor T1 and the second MOS transistor T2 in the R sub-pixel.

Then, the data line selection signal Mux G controls the first MOS transistor T1 corresponding to the G sub-pixel to be turned on, the data line control signal (Data from IC) inputted by the driving chip charges the G sub-pixel to a target voltage through the first MOS transistor T1 and the second MOS transistor T2 in the G sub-pixel. Finally, the data line selection signal Mux B controls the first MOS transistor T1 corresponding to the B sub-pixel to be turned on. The data line control signal (Data from IC) charges the B sub-pixel to a target voltage through the first MOS transistor T1 and the second MOS transistor T2. Wherein, the target voltage is a sum of a voltage of the data line control signal (Data from IC) and a threshold voltage Vth of the third MOS transistor.

In the embodiment of the present invention, the first MOS transistor unit 101 includes a sixth MOS transistor T6 and a seventh MOS transistor T7. Gates of the sixth MOS transistor T6 and the seventh MOS transistor T7 are connected with a first scanning signal Scan(n), a drain of the sixth MOS transistor T6 is connected with a gate of the third MOS transistor T3, a source of the sixth MOS transistor T6 is connected with a drain of the seventh MOS transistor T7. A source of the seventh MOS transistor T7 is connected with a source of the third MOS transistor T3. When the first scanning signal Scan(n) controls the first MOS transistor MOS unit 101 to be turned on, the first scanning signal Scan(n) is required to control the sixth MOS transistor T6 and the seventh MOS transistor T7 to be turned on simultaneously. Of course, in another embodiment of the present invention, the first MOS transistor unit 101 can only include one MOS transistor.

Besides, in the embodiment of the present invention, each of the first MOS transistor T1, the second MOS transistor T2, the third MOS transistor T3, the sixth MOS transistor T6 and the seventh MOS transistor T7 is a PMOS transistor. However, each of the first MOS transistor T1, the second MOS transistor T2, the third MOS transistor T3, the sixth MOS transistor T6 and the seventh MOS transistor T7 can also be a NMOS transistor.

Step S12: receiving a control signal to control the pixel unit to display a corresponding grayscale level according to the target voltage.

In the embodiment of the present invention, each sub-pixel circuit further includes a eight MOS transistor T8 and a ninth MOS transistor T9. Gates of the eight MOS transistor T8 and the ninth MOS transistor T9 are connected with the control signal EM. A drain of the eight MOS transistor T8 is connected with a first reference voltage VDD, a source of the eight MOS transistor T8 is connected with the source of the third MOS transistor T3. A source of the ninth MOS transistor T9 is connected with the drain of the third MOS transistor T3, a drain of the ninth MOS transistor T9 is connected with a positive electrode of a light-emitting diode (OLED), a negative electrode of the light-emitting diode (OLED) is connected with a second reference voltage (VSS).

In the step S12, the control signal EM controls the eight MOS transistor T8 and the ninth MOS transistor T9 to be turned on, and the light-emitting diode (OLED) emits light according a current formed by the target voltage to display a corresponding grayscale level.

In the embodiment of the present invention, each sub-pixel circuit 10 further includes an fourth MOS transistor T4 and a fifth MOS transistor T5, gates of the fourth MOS transistor T4 and the fifth MOS transistor T5 are connected with a second scanning signal Scan(n+1). A drain of the fourth MOS transistor T4 is connected with the gate of the third MOS transistor T3, a source of the fourth MOS transistor T4 is connected with a drain of the fifth MOS transistor T5. A source of the fifth MOS transistor T5 is connected with a reset signal VI. Correspondingly, before the step S10, the second scanning signal Scan(n+1) controls the fourth MOS transistor T4 and the fifth MOS transistor T5 to be turned on, and the reset signal VI is transmitted to the gate of the third MOS transistor T3 to perform a resetting.

Figure 4:
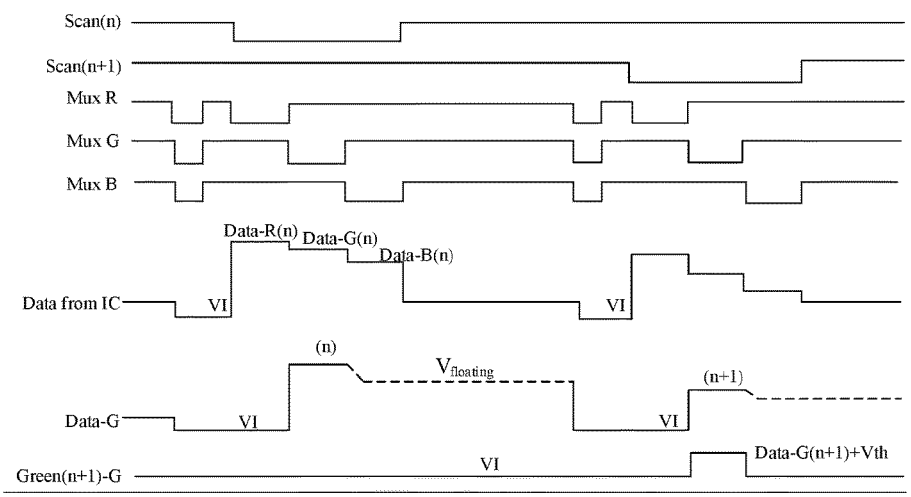
FIG. 4 is a timing diagram of the pixel circuit according to an embodiment of the present invention.

FIG. 4 is a timing diagram of the pixel circuit according to the embodiment of the present invention. The corresponding pixel circuit can refer to FIG. 2 and FIG. 3. Wherein, the first MOS transistor T1, the second MOS transistor T2, the third MOS transistor T3, the sixth MOS transistor T6, the seventh MOS transistor T7, the eighth MOS transistor T8, the ninth MOS transistor T9, the fourth MOS transistor T4 and fifth MOS transistor T5 are all PMOS transistors.

As shown in FIG. 4, the working process of timing is as following:

First of all, simultaneously turning on the data line selection signals Mux R, Mux G, Mux B, and the data line control signal (data from IC) resets the data lines Data-R, Data-G, Data-B respectively corresponding to the R sub-pixel, the G sub-pixel, the B sub-pixel as the reset signal VI. Then, the first scanning signal Scan(n) becomes a low level. When the data line selection signal Mux R is at a low level, the data line control signal (Data from IC) charges the data line Data-R corresponding to an R sub-pixel of an n-th row. The voltage of the gate Red(n) G of the third transistor T3 in the R sub-pixel becomes $V_{Data-R}$+Vth. Then, the data line selection signal Mux G becomes a low level, and the data line control signal (Data from IC) charges the data line Data-G corresponding to the G sub-pixel of the n-th row. The voltage of the gate Green(n) G of the third transistor T3 in the G sub-pixel becomes $V_{Data-G}$+Vth.

Then, the data line selection signal Mux B becomes a low level, and the data line control signal (Data from IC) charges the data line Data-B corresponding to the B sub-pixel of the n-th row. The voltage of the gate Blue(n) G of the third transistor T3 in the B sub-pixel becomes $V_{Data-B}$+Vth. Accordingly, charging of the R sub-pixel, the G sub-pixel, the B sub-pixel of the n-th row is finished, and the R sub-pixel, the G sub-pixel, the B sub-pixel are all charged to target voltages. Before charging (n+1)-th row, the data line selection signals Mux R, Mux G, Mux B are simultaneously turned on, the data line control signal (data from IC) resets the data lines Data-R, Data-G, Data-B respectively corresponding to the R sub-pixel, the G sub-pixel, the B sub-pixel to the reset signal VI. Then, the control signal EM controls the sixth MOS transistor T6 and the seventh MOS transistor T7 to be turned on, the light-emitting diode OLED emits light according to a current formed by the target voltage, and displays a corresponding grayscale level.

At this time, the data lines Data-R, Data-G, Data-B corresponding to the R sub-pixel, the G sub-pixel, the B sub-pixel have a higher floating voltage $V_{floating}$. If in the next period, directly charging the data lines Data-R, Data-G, Data-B corresponding to the R sub-pixel, the G sub-pixel, the B sub-pixel, and if the voltage $V_{Data-G}$ required to be achieved by charging is less than $V_{floating}$, unable charging phenomenon will occur, the data line Data-G remains at the floating voltage $V_{floating}$ such that the G sub-pixel cannot reach the target voltage $V_{Data-G}$+Vth at that period so as to maintain at a charging voltage $V_{floating}$+Vth. When the $V_{Data-G}$ is smaller and the grayscale level is higher, the phenomenon is more obvious.

Therefore, in the embodiment of the present invention, when the scan(n+1) signal become a low level, the data line selection signal Mux R also becomes a low level, the data line control signal (Data from IC) charges the data line Data-R corresponding to the R sub-pixel of the (n+1)-th row, the voltage of the gate Red(n) R of the third MOS transistor T3 in the R sub-pixel of the (n+1)-th row becomes $V_{Data-R}$+Vth. At this time, each of the data line Data-G corresponding to the G sub-pixel and the data line Data-B corresponding to the B sub-pixel is the reset signal VI, which is a very low level so that a situation that the gate Green(n+1) G of the third MOS transistor T3 in the G sub-pixel or the gate Blue(n+1) B of the third MOS transistor T3 in the B sub-pixel is incorrectly charged to $V_{floating}$+Vth will be avoided. Accordingly, in the present timing, each sub-pixel can be normally charged to a target voltage in order to prevent a wrong charging which will generate an abnormal display, and the picture display quality can be greatly improved.

Wherein, the dotted line portion in FIG. 4 is the floating voltage $V_{floating}$, and the specific value is not determined, and is related to the grayscale level displayed by the sub-pixel in the previous period.

In summary, the present invention can effectively prevent a wrong charging which will generate an abnormal picture display through receiving a data control signal inputted by a driving chip and resetting a data line of a pixel unit according to the data control signal; charging the pixel unit to a target voltage according to the data line control signal; and receiving a control signal to control the pixel unit to display a corresponding grayscale level according to the target voltage.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A driving method for a pixel circuit, comprising steps of:
receiving a data line control signal inputted by a driving chip and resetting a data line of a pixel unit according to the data line control signal, wherein the pixel unit comprises a red (R) sub-pixel, a green (G) sub-pixel and a blue (B) sub-pixel, and according to the received data line control signal, simultaneously resetting the R sub-pixel, the G sub-pixel and the B sub pixel;
charging the pixel unit to a target voltage according to the data line control signal; and
receiving a control signal to control the pixel unit to display a corresponding grayscale level according to the target voltage,
wherein the pixel circuit comprises a first-metal oxide semiconductor(MOS) transistor, a gate of the first MOS transistor is connected with a data line selection signal, a drain of the first MOS transistor receives the data line control signal inputted by a driving chip, and a source of the first MOS transistor is connected with the data line,
wherein the step of receiving a data line control signal inputted by a driving chip and resetting a data line of a pixel unit according to the data line control signal comprises a step of: controlling the first MOS transistor to be turned on by the data line selection signal, and inputting the data line control signal inputted by the driving chip to the data line through the first MOS transistor and resetting the data line,
wherein the pixel circuit includes a R sub-pixel circuit, a G sub-pixel circuit and a B sub-pixel circuit, each sub-pixel circuit further comprises a second MOS transistor, a third MOS transistor and a first MOS transistor unit; a gate of the second MOS transistor is connected with a first scanning signal, a drain of the second MOS transistor is connected with a source of the third MOS transistor, a gate and a drain of the third MOS transistor are connected with the first MOS transistor unit; and the first MOS transistor unit further connects with the first scanning signal, wherein a voltage of the gate of the third MOS transistor is a voltage of the sub-pixel; and
the step of charging the pixel unit to a target voltage according to the data line control signal comprises a step of: sequentially for the R sub-pixel, the G sub-pixel and the B sub-pixel,
controlling the second MOS transistor and the first MOS transistor unit to be turned on by the first scanning signal, and controlling the first MOS transistor to be turned on by the data line selection signal;
and charging the sub-pixel to the target voltage through the first MOS transistor and the second MOS transistor by the data line control signal inputted by the driving chip, and
wherein each sub-pixel circuit further comprises an fourth MOS transistor and a fifth MOS transistor, gates of the fourth MOS transistor and the fifth MOS transistor are connected with a second scanning signal, a drain of the fourth MOS transistor is connected with the gate of the third MOS transistor, a source of the fourth MOS transistor is connected with a drain of the fifth MOS transistor, and a source of the fifth MOS transistor is connected with a reset signal; and
before the step of receiving a data line control signal inputted by a driving chip, controlling the fourth MOS transistor and the fifth MOS transistor to be turned on by the second scanning signal, and transmitting the reset signal to the gate of the third MOS transistor to perform a resetting.

2. The driving method according to claim 1, wherein the step of charging the pixel unit to a target voltage comprises a step of: sequentially charging the R sub-pixel, the G sub-pixel and the B sub-pixel to corresponding target voltages.

3. The driving method according to claim 1, wherein the first MOS transistor unit comprises a sixth MOS transistor and a seventh MOS transistor, gates of the sixth MOS transistor and the seventh MOS transistor are connected with the first scanning signal, a drain of the sixth MOS transistor is connected with the gate of the third MOS transistor, a source of the sixth MOS transistor is connected with a drain of the seventh MOS transistor, and a source of the seventh MOS transistor is connected with the drain of the third MOS transistor;
the step of controlling the first MOS transistor unit to be turned on by the first scanning signal comprises a step of: controlling the sixth MOS transistor and the seventh MOS transistor to be turned on simultaneously by the first scanning signal.

4. The driving method according to claim 3, wherein each of the first MOS transistor, the second MOS transistor, the third MOS transistor, the sixth MOS transistor and the seventh MOS transistor is a PMOS transistor.

5. The driving method according to claim 3, wherein each of the first MOS transistor, the second MOS transistor, the third MOS transistor, the sixth MOS transistor and the seventh MOS transistor is a NMOS transistor.

6. The driving method according to claim 3, wherein each sub-pixel circuit further includes a eighth MOS transistor and a ninth MOS transistor, gates of the eighth MOS transistor and the ninth MOS transistor are connected with the control signal, a source of the eighth MOS transistor is connected with a first reference voltage, a drain of the eighth MOS transistor is connected with the source of the third MOS transistor, a source of the ninth MOS transistor is connected with the drain of the third MOS transistor, a drain of the ninth MOS transistor is connected with a positive electrode of a light-emitting diode, and a negative electrode of the light-emitting diode is connected with a second reference voltage; and
the step of receiving a control signal to control the pixel unit to display a corresponding grayscale level according to the target voltage comprises a step of: controlling the eighth MOS transistor and the ninth MOS transistor to be turned on by the control signal, and the light-emitting diode emits light according a current formed by the target voltage to display the corresponding grayscale level.

7. A driving method for a pixel circuit, comprising steps of:
receiving a data line control signal inputted by a driving chip and resetting a data line of a pixel unit according to the data line control signal;
charging the pixel unit to a target voltage according to the data line control signal; and
receiving a control signal to control the pixel unit to display a corresponding grayscale level according to the target voltage,
wherein the pixel circuit includes a red (R) sub-pixel circuit, a green (G) sub-pixel and a blue (B) sub-pixel circuit, each sub-pixel circuit further comprises a second metal oxide semiconductor(MOS) transistor, a third MOS transistor and a first MOS transistor unit; a gate of the second MOS transistor is connected with a first scanning signal, a drain of the second MOS transistor is connected with a source of the third MOS transistor, a gate and a drain of the third MOS transistor are connected with the first MOS transistor unit; and the first MOS transistor unit further connects with the first scanning signal, wherein a voltage of the gate of the third MOS transistor is a voltage of the sub-pixel; and the step of charging the pixel unit to a target voltage according to the data line control signal comprises a step of: sequentially for the R sub-pixel, the G sub-pixel and the B sub-pixel, controlling the second MOS transistor and the first MOS transistor unit to be turned on by the first scanning signal, and controlling a first MOS transistor to be turned on by the data line selection signal;

and charging the sub-pixel to the target voltage through the first MOS transistor and the second MOS transistor by the data line control signal inputted by the driving chip, and wherein each sub-pixel circuit further includes an fourth MOS transistor and a fifth MOS transistor, gates of the fourth MOS transistor and the fifth MOS transistor are connected with a second scanning signal, a drain of the fourth MOS transistor is connected with the gate of the third MOS transistor, and a source of the fourth MOS transistor is connected with a drain of the fifth MOS transistor, and a source of the fifth MOS transistor is connected with a reset signal; and before the step of receiving a data line control signal inputted by a driving chip, controlling the fourth MOS transistor and the fifth MOS transistor to be turned on by the second scanning signal, and transmitting the reset signal to the gate of the third MOS transistor to perform a resetting.

8. The driving method according to claim 7, wherein the pixel unit comprises a R sub-pixel, a G sub-pixel and a B sub-pixel, and the step resetting a data line of a pixel unit comprises a step of according to the received data line control signal, simultaneously resetting the R sub-pixel, the G sub-pixel and the B sub pixel.

9. The driving method according to claim 8, wherein the step of charging the pixel unit to a target voltage comprises a step of: sequentially charging the R sub-pixel, the G sub-pixel and the B sub-pixel to corresponding target voltages.

10. The driving method according to claim 7, wherein a gate of the first MOS transistor is connected with a data line selection signal, a drain of the first MOS transistor receives the data line control signal inputted by a driving chip, and a source of the first MOS transistor is connected with the data line; and wherein the step of receiving a data line control signal inputted by a driving chip and resetting a data line of a pixel unit according to the data line control signal comprises a step of: controlling the first MOS transistor to be turned on by the data line selection signal controls, and inputting the data line control signal inputted by the driving chip to the data line through the first MOS transistor and resetting the data line.

11. The driving method according to claim 7, wherein the first MOS transistor unit comprises a sixth MOS transistor and a seventh MOS transistor, gates of the sixth MOS transistor and the seventh MOS transistor are connected with the first scanning signal, a drain of the sixth MOS transistor is connected with the gate of the third MOS transistor, a source of the sixth MOS transistor is connected with a drain of the seventh MOS transistor, and a source of the seventh MOS transistor is connected with the drain of the third MOS transistor; and the step of controlling the first MOS transistor unit to be turned on by the first scanning signal comprises a step of: controlling the sixth MOS transistor and the seventh MOS transistor to be turned on simultaneously by the first scanning signal.

12. The driving method according to claim 11, wherein each of the first MOS transistor, the second MOS transistor, the third MOS transistor, the sixth MOS transistor and the seventh MOS transistor is a PMOS transistor.

13. The driving method according to claim 11, wherein each of the first MOS transistor, the second MOS transistor, the third MOS transistor, the sixth MOS transistor and the seventh MOS transistor is a NMOS transistor.

14. The driving method according to claim 11, wherein each sub-pixel circuit further includes a eighth MOS transistor and a ninth MOS transistor, gates of the eighth MOS transistor and the ninth MOS transistor are connected with the control signal, a source of the eighth MOS transistor is connected with a first reference voltage, a drain of the eighth MOS transistor is connected with the source of the third MOS transistor, a source of the ninth MOS transistor is connected with the drain of the third MOS transistor, a drain of the ninth MOS transistor is connected with a positive electrode of a light-emitting diode, and a negative electrode of the light-emitting diode is connected with a second reference voltage; and the step of receiving a control signal to control the pixel unit to display a corresponding grayscale level according to the target voltage comprises a step of: controlling the eighth MOS transistor and the ninth MOS transistor to be turned on by the control signal, and the light-emitting diode emits light according a current formed by the target voltage to display the corresponding grayscale level.

* * * * *